United States Patent [19]
Frosien et al.

[11] Patent Number: 6,107,633
[45] Date of Patent: Aug. 22, 2000

[54] ELECTRON BEAM LENS

[75] Inventors: Jürgen Frosien, Riemerling; Stefan Lanio, Erding; Gerald Schönecker, Munich, all of Germany

[73] Assignee: Advantest Corporation, Tokyo, Japan

[21] Appl. No.: 09/113,048

[22] Filed: Jul. 9, 1998

[30] Foreign Application Priority Data

Sep. 29, 1997 [EP] European Pat. Off. ............ 97 116 909

[51] Int. Cl.[7] ................ G21K 1/08; H01J 3/14; H01J 3/26
[52] U.S. Cl. ................ 250/396 ML; 250/396 R
[58] Field of Search ................ 250/396 ML, 396 R, 250/310

[56] References Cited

U.S. PATENT DOCUMENTS

| | | | |
|---|---|---|---|
| 5,760,550 | 6/1998 | Sukeno et al. ................ | 315/382.1 |
| 5,780,859 | 7/1998 | Feuerbaum et al. ................ | 250/396 |
| 5,895,917 | 4/1999 | Ueda et al. ................ | 250/310 |
| 5,929,451 | 7/1999 | Kojima et al. ................ | 250/396 |

FOREIGN PATENT DOCUMENTS 0 133 016  2/1985  European Pat. Off. .

*Primary Examiner*—Seungsook Ham
*Assistant Examiner*—John Patti
*Attorney, Agent, or Firm*—Reising, Ethington, Barnes, Kisselle, Learman & McCulloch, P.C.

[57] ABSTRACT

An electron beam lens has a magnetic lens provided with first and second pole pieces for influencing an electron beam and forming a magnetic field between the two pole pieces. A third pole piece is provided, but is not in magnetic contact with the two other pole pieces. The third pole piece is immersed in the magnetic field formed between the first and second pole pieces and extracts a part of such magnetic field. Also disclosed is a cathode lens and an electron beam device for use with such an electron beam lens.

16 Claims, 5 Drawing Sheets

ELECTRON BEAM LENS

The invention relates to an electron beam lens comprising a magnetic lens for influencing an electron beam with a first and a second pole piece, wherein a magnetic field is formed between the two pole pieces and furthermore a third pole piece is provided. The invention also relates to a cathode lens and an electron beam device with such an electron beam lens.

BACKGROUND OF THE INVENTION

In particle beam lenses the aim is to combine good optical properties for the primary beam with good collecting properties for the secondary beams. In this case the starting point is conventional double-pole lenses consisting of an inner and an outer pole piece, wherein the lens-producing magnetic field is located largely within the physical lens. In this connection single-pole lenses have also been used, in which one pole is drawn out or the air gap which produces the magnetic field is disposed at the upper or lower end of the lens so that the magnetic field propagates largely outside the lens body.

A multi-pole lens is known from EP-A-0 133 016 which consists essentially of a row of two double-pole lenses of the type described above.

Starting from the prior art, the object of the invention is to make further improvements to the electron beam lens and particularly in its optical properties for the primary beam and in its collecting properties for the secondary beams.

SUMMARY OF THE INVENTION

The electron beam lens according to the invention is distinguished in that the third pole piece is not in magnetic contact with the two other pole pieces and is immersed into the magnetic field formed between the first and second pole pieces and extracts a part of this magnetic field.

The extracted part of the (principal) magnetic field forms a second lens field (subsidiary field) at the lower end of the third pole piece. On the one hand the subsidiary field has a focussing effect on the primary beam and because of its proximity to the specimen has good optical properties and on the other hand it prevents the secondary beams from widening. Therefore the secondary beam can enter the lens system "bundled" and can be detected highly efficiently by a spectrometer/detector arrangement or a detector in or above the lens.

In one embodiment of the invention the electron beam lens is advantageously used in a cathode lens. What is achieved by the subsidiary field generated by the third pole piece is that the magnetic field with the positive action can be brought close to the cathode without a large physical lens being necessary for this. By suitable design of the three-pole magnetic lens the strength of the subsidiary field on the cathode tip and the optical properties of the first and second pole pieces which act as condenser can be separately optimised.

In another embodiment the electron beam lens is used in an electron beam device. With a tiltable specimen holder the specimens can be tilted relative to the primary beam. The special construction of the electron beam lens facilitates strong tilting with a short working distance or offers space for other optional elements such as detectors, manipulators, etc.

Preferred embodiment of the invention are explained in greater detail below with reference to the drawings, in which:

THE DRAWINGS

FIG. 1b shows a representation of the magnetic field distribution of the lens according to FIG. 1a;

FIG. 2b shows a representation of the magnetic field distribution of the lens according to FIG. 2a;

DETAILED DESCRIPTION

Figure 1A:
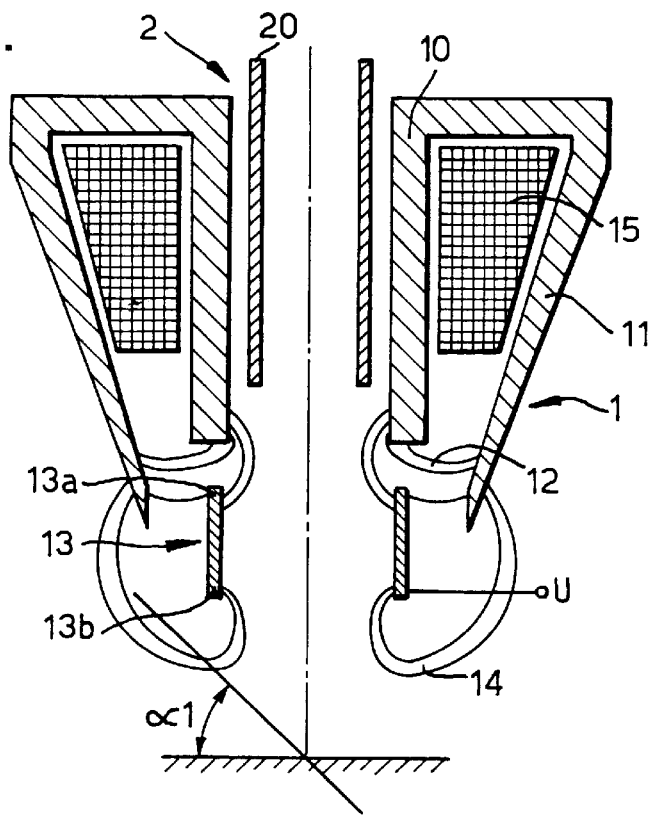
FIG. 1a shows a schematic representation of an electron beam lens of a first embodiment of the invention.

The electron beam lens shown in FIG. 1a has a magnetic lens 1 for influencing an electron beam with a first, inner pole piece 10 and a second, outer pole piece 11. In the illustrated embodiment the first and second pole pieces 10, 11 are shown as a double-pole lens with a conically constructed outer pole piece 11 and a coil 15, a magnetic principal field 12 being formed between the first and second pole pieces.

The magnetic lens 1 also has a third pole piece 13 which is not in magnetic contact with the two other pole pieces and is immersed into the magnetic field formed between the first and second pole pieces 10, 11. The third pole piece 13 is preferably of cylindrical construction and is immersed into the principal field 12 in such a way that a part of this magnetic field is extracted.

The field "absorbed" at the upper end 13a of the third pole piece 13 forms a magnetic subsidiary field 14 at the lower end 13b of the third pole piece 13. Thus a part of the field of the inner pole piece 10 passes over into the third pole piece 13 and produces at the end 13b the shunt to the outer pole piece 11 with the subsidiary field being formed.

Figure 1B:
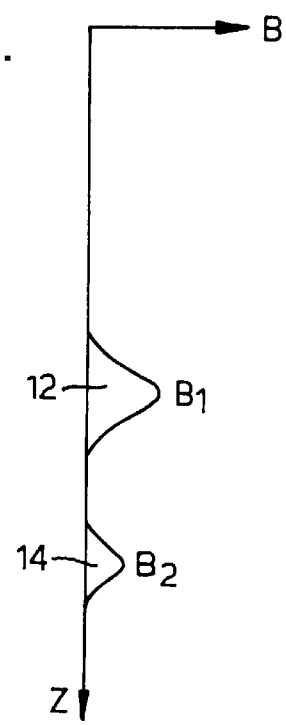

The propagation of the principal field 12 and of the subsidiary field 14 is shown in FIG. 1b. By the insertion of the third pole piece 13 two lens fields can be created in a short spatial distance. The strength of the subsidiary field 14 depends upon how far the third pole piece 13 is immersed into the principal field and extracts a corresponding portion of the magnetic field and how large the gap is to the inner or outer pole piece 10, 11. In order to adjust the strength of the subsidiary field 14 the third pole piece 13 is advantageously disposed so as to be displaceable or adjustable with respect to the first and second pole pieces 10, 11.

The maximum values of the axial magnetic fields of the principal or subsidiary field are denoted by $B_1$ or $B_2$ respectively. The third pole piece is preferably disposed with respect to the first and second pole pieces in such a way that the amplitude $B_2$ of the subsidiary field amounts to at least 15%, preferably between 20% and 60% of the amplitude $B_1$ of the principal field.

Figure 2A:
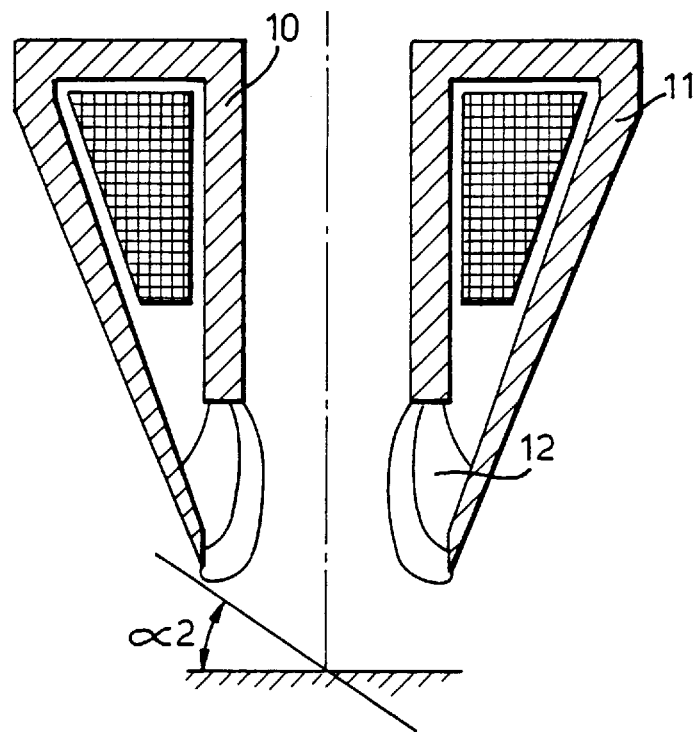
FIG. 2a shows a schematic representation of an electron beam lens according to the prior art.
Figure 2B:
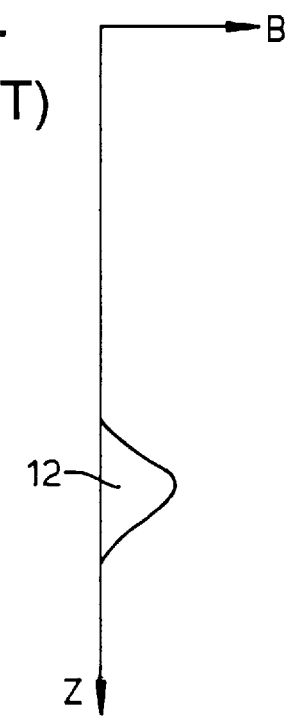

For comparison with the "magnetic three-pole lens" illustrated in FIG. 1a, FIG. 2a shows a conventional double-pole lens with a first and second pole 10, 11. Accordingly only one magnetic field 12 is formed, the distribution of which is illustrated in FIG. 2b.

Figure 3:
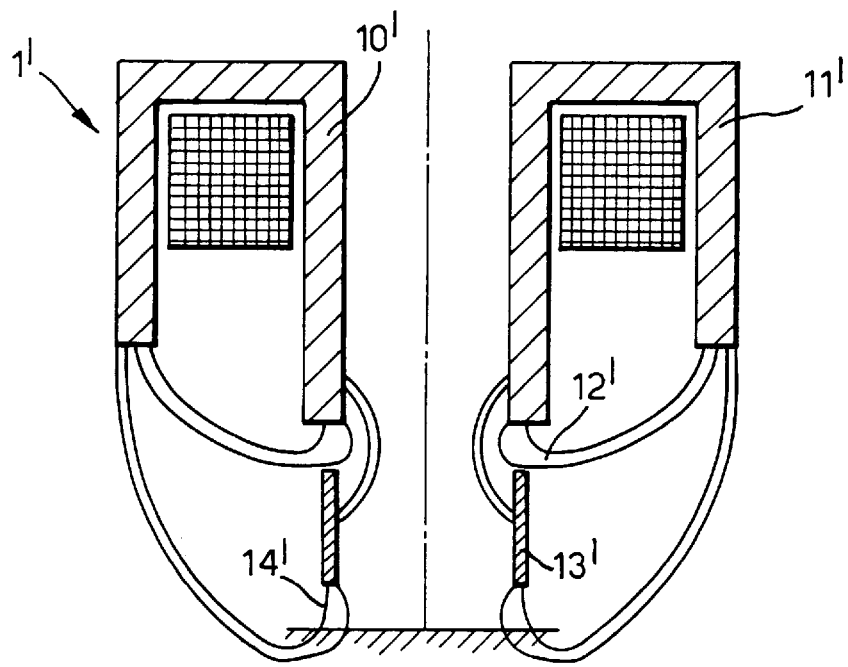
FIG. 3 shows a schematic representation of an electron beam lens of a second embodiment of the invention.

FIG. 3 shows a second embodiment of an electron beam lens according to the invention which differs from the embodiment according to FIG. 1a only in that the part of the magnetic lens 1' formed by a first pole piece 10' and by a second pole piece 11' is constructed as a single-pole lens. Here too, however, a principal field and a subsidiary field 12' 14' are formed. The advantage of using a single-pole lens in combination with a third pole piece 13' resides above all in the fact that with the single-pole lens a particularly strong magnetic field is generated and accordingly a strong part can be passed on as subsidiary field 14'.

The two electron beam lenses illustrated in FIGS. 1a and 3 can also advantageously be combined with an electrostatic lens, particularly an electrostatic retarding lens. The electrostatic lens consists of at least one first and one second electrode which can be supplied with differing potentials. By way of example an electrostatic lens 2 is illustrated in FIG. 1a in which the first electrode consists of a beam tube 20 disposed coaxially with the first pole piece 10 in the interior of the magnetic lens 1. The second electrode is formed by the third pole piece 13. Whilst the beam tube 20 is for example at high positive potential, a suitable lower-positive or negative voltage U could be applied to the third pole piece 13 in order to produce the desired retarding effect on the electron beam.

Figure 4:
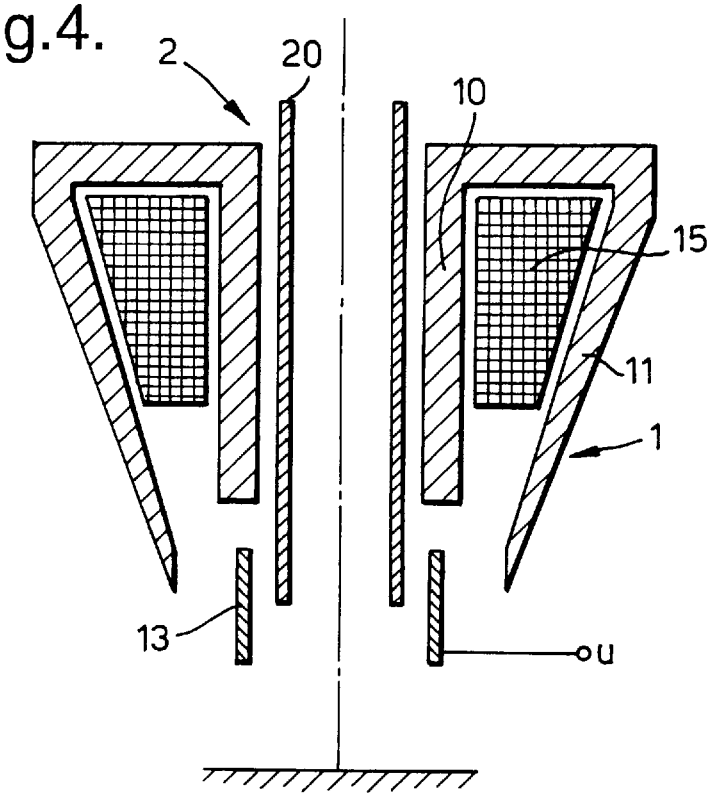
FIG. 4 shows a schematic representation of an electron beam lens of a third embodiment of the invention.

There are various possibilities for the construction of the electrostatic lens within the electron beam lens. In FIG. 4 the beam tube 20 is drawn further downwards so that it is immersed in the third pole piece 13. The electrostatic lens is formed in this case in the region of the immersed end of the first electrode 20 and the adjoining wall of the third pole piece 13.

Figure 5:
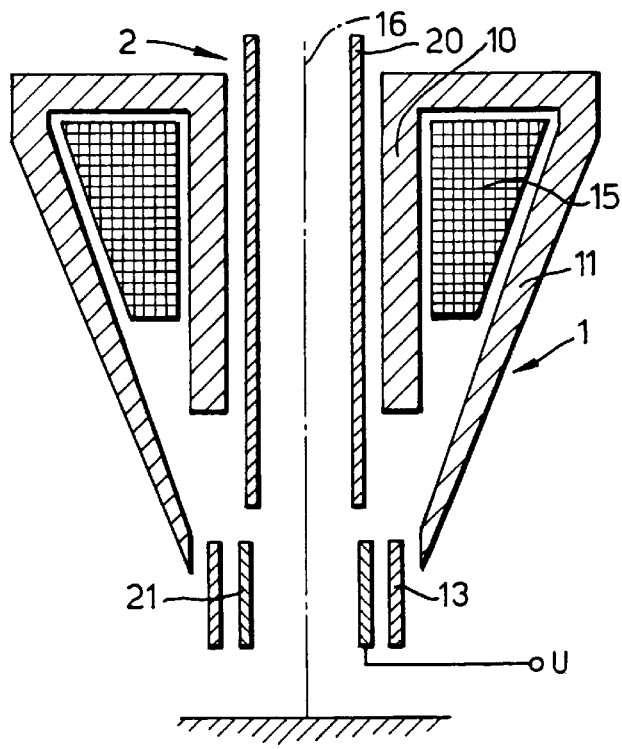
FIG. 5 shows a schematic representation of an electron beam lens of a fourth embodiment of the invention.

In the embodiment according to FIG. 5 the second electrode of the electrostatic lens 2 is formed not by the third pole piece 13 but by a separate tube electrode 21 inserted into the pole piece 13. Within the scope of the invention it would also be conceivable for this tube electrode 21 to be interrupted one or more times at right angles to the optical axis 16 in order thereby to build up the electrostatic lens by at least three electrodes.

Figure 6:
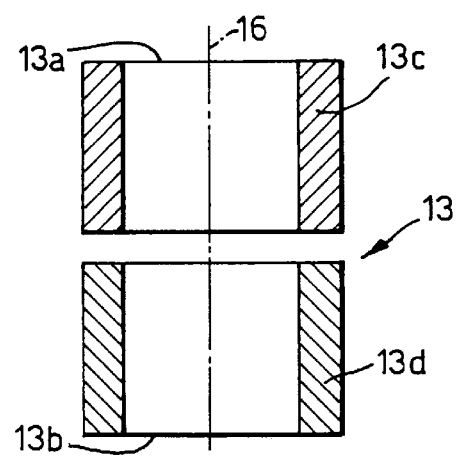
FIG. 6 shows a detail of the third pole piece according to a fifth embodiment.

FIG. 6 shows an alternative possibility for building up the electrostatic lens from more than two electrodes.

In this embodiment the third pole piece 13 again forms a part of the electrostatic lens, the pole piece being divided into a first part 13c and a second part 13d at right angles to the optical axis 16. These two parts 13c, 13d form the second and third electrodes of the electrostatic lens and can be supplied with different potentials for this purpose.

So long as the gap between the two parts 13c, 13d of the third pole piece 13 is chosen to be as small as possible the "absorbed" magnetic field is led unhindered from the upper end 13a to the lower end 13b.

Figure 7:
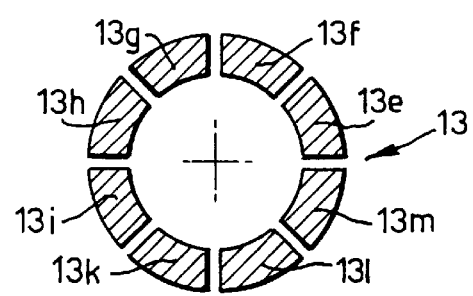
FIG. 7 shows a detail of the third pole piece according to a sixth embodiment.

In FIG. 7 an embodiment is illustrated in which the second electrode of the electrostatic lens is again formed by the third pole piece. However, this third pole piece is slotted in the direction of the optical axis 16, so that in the illustrated embodiment eight segments 13e, 13f, 13g, 13h, 13i, 13k, 13l, 13m are formed. These segments constitute electrical multipole elements which by suitable application of voltages can be connected and used as electrostatic deflectors, stigmators or the like. The individual voltages are chosen in this case so that an average voltage is produced which corresponds to the voltage U of the second electrode. However, a smaller or larger number of segments is also conceivable.

Figure 8:
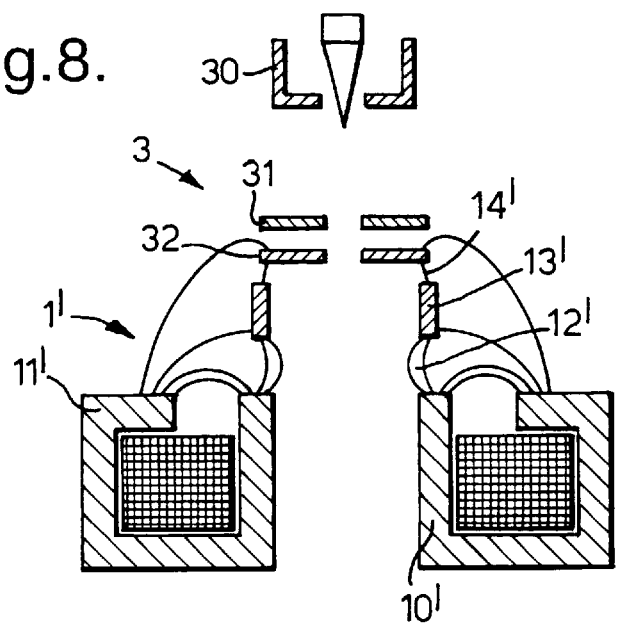
FIG. 8 shows a schematic representation of a cathode lens with an electron beam lens according to the invention and FIG. 9 shows a schematic representation of an electron beam device.

FIG. 8 shows an example of an application of the illustrated electron beam lenses in a cathode lens 3. The cathode lens 3 consists essentially of a cathode 30 with "suppressor" electrode, an extraction electrode 31, an anode 32 and an electron beam lens according to one of the two embodiments shown in FIGS. 1a, 3 to 7. Here the electron beam lens 1' according to FIG. 3 has been chosen. The electron beam lens is installed so that the subsidiary field 14' which forms can be brought as close as possible to the cathode 30 and the single-pole lens formed by the two pole pieces 10', 11' acts as condenser.

By suitable design of the three pole pieces 10', 11', 13' the magnetic field strength of the subsidiary field 14' on the cathode and the optical properties of the principal field 12' can be optimised separately from one another.

Figure 9:
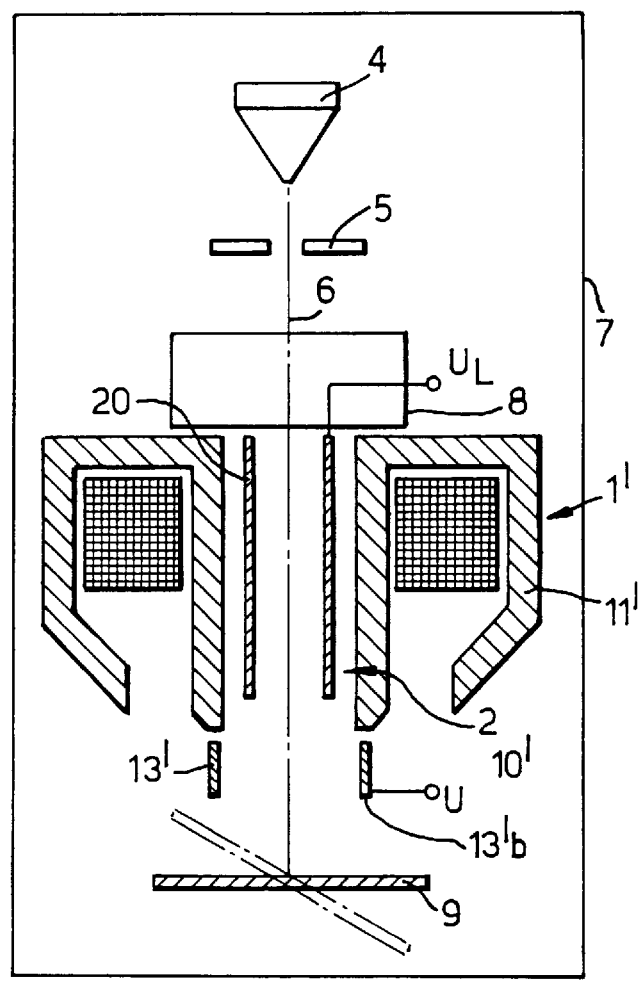

Finally, in FIG. 9 an application of the electron beam lens in an electron beam device is illustrated. The electron beam device is formed by an optical column 7 which essentially has a source 4 for generating an electron beam 6, a magnetic lens 1' as well as a spectrometer/detector arrangement 8. Apart from a plurality of magnetic and/or electrical lenses and apertures for influencing the electron beam, in the embodiment according to FIG. 9 a blanking system 5 and a tiltable specimen stage 9 is also shown.

The electron beam lens used here corresponds again to the embodiment illustrated in FIG. 3. in which the two first pole pieces 10', 11' form a single-pole lens which is combined with a third pole piece 13'. The electrostatic lens 2 is again formed by a beam tube 20 inserted into the single-pole lens as first electrode and by the lower part of the third pole piece 13' as second electrode. The beam tube 20 and the part of the third pole piece 13' serving as second electrode can be supplied with different potentials $U_L$ and U respectively.

The illustrated spectrometer/detector arrangement 8 or a detector is disposed before or above the magnetic lens 1' in the direction of the electron beam 6. However, it would also be conceivable to provide the detector within the magnetic lens 1'. The construction of the detectors can be chosen as required to be one-sided, rotationally symmetrical or in segmented form or also as combined backscatter/secondary electron detectors. However, an arrangement of the detector between magnetic lens and specimen would be conceivable.

The subsidiary field forming between the specimen disposed on the specimen stage 9 and the lower end 13'b of the third pole piece 13' on the one hand has a focussing effect on the primary electron beam and on the other hand has good optical properties because of its proximity to the specimen. This subsidiary field also has the effect that the released secondary electrons do not spread out but rather they enter the electron beam lens in bundled form and can be detected highly efficiently by the spectrometer/detector arrangement 8.

It is quite conceivable to apply a positive extraction voltage to the third pole piece 13', but an additional electrode can also be used. However, positive extraction fields with voltages below 100 V are advantageous, since in this way the electrical charging of isolating specimens is minimised. However, higher electrical fields and thus a combined electrical/magnetic lens are also conceivable and sometimes desirable.

The construction of the magnetic lens 1' as a three-pole lens with the three pole pieces 10', 11', 13' also has the advantage that the lower end of this three-pole lens is of smaller or more pointed construction than in the case of conventional double-pole lenses. This construction is particularly advantageous especially in the case of tiltable specimen stages, since a greater angle of tilt α can be achieved thereby. In this connection reference may be made again to the two FIGS. 1*a* and 2*a*, which each show the maximum angle of tilt $\alpha_1$ or $\alpha_2$ respectively. In the electron beam lens according to the invention the maximum angle of tilt $\alpha_1$ is greater than the angle $\alpha_2$ in the prior art. This property is helpful particularly in the examination of specimens with a very short working distance, since then an even greater angle of tilt is available.

So long as the specimen stage is constructed so that it is not tiltable, the additional space available can be utilised for optional elements such as detectors, manipulators, etc.

What is claimed is:

1. Electron beam lens comprising a magnetic lens for influencing an electron beam having a first and a second pole piece, wherein a magnetic field is formed between the two pole pieces and furthermore a third pole piece is provided, characterised in that the third pole piece is not in magnetic contact with either of the first or second pole pieces and is immersed into the magnetic field formed between the first and second pole pieces and extracts a part of said magnetic field.

2. Electron beam lens as claimed in claim 1, wherein the third pole piece is of cylindrical construction.

3. Electron beam lens as claimed in claim 1, wherein the third pole piece is disposed displaceable relative to the first and second pole pieces.

4. Electron beam leans as claimed in claim 1, wherein the first and second pole pieces are constructed as a double-pole lens.

5. Electron beam lens as claimed in claim 4, wherein the double-pole lens is of conical construction.

6. Electron beam lens as claim in claim 1, wherein the first and second pole pieces are constructed as a single-pole lens.

7. Electron beam lens as claimed in claim 1, wherein an ectrostatic lens is provided within the magnetic lens.

8. Electron beam lens as claimed in claim 7, wherein the electrostatic lens is constructed as a retarding lens.

9. Electron beam lens as claimed in claim 7, wherein the electrostatic lens has at least one first and one second electrode be for application thereto of different potentials.

10. Electron beam lens as claimed in claim 7, characterised in that the electrostatic lens has at least two electrodes, one of which is formed by the third pole piece.

11. Electron beam lens as claimed in claim 10, characterised in that the third pole piece is divided into segments for application thereto of different potentials.

12. Electron beam lens as claimed in claim 7, the electrostatic lens at least two electrodes, one of which comprises a beam tube extend through a part of the magnetic lens.

13. Cathode lens having a cathode, an extraction electrode, an anode, and an electron beam lens as according to any one of claims 1 to 11.

14. Electron beam device having a source for generating an electron beam, and an electron beam lens according to any claimed one of claims 1 to 11 for focussing the electron beam onto a specimen.

15. Electron beam device as claimed in claim 14, including a tiltable specimen stage for supporting said specimen.

16. Electron beam device as claimed in claim 14, including spectrometer/detector means for detecting secondary particles released on the specimen.

* * * * *

UNITED STATES PATENT AND TRADEMARK OFFICE
CERTIFICATE OF CORRECTION

PATENT NO. : 6,107,633
DATED : August 22, 2000
INVENTOR(S) : Jurgen Frosien et al It is certified that error appears in the above-identified patent and that said Letters Patent is hereby corrected as shown below:

Claim 12, line 2, after "lens" insert -- has --.

Signed and Sealed this

Twenty-ninth Day of May, 2001

Attest:

NICHOLAS P. GODICI

*Attesting Officer*   *Acting Director of the United States Patent and Trademark Office*